United States Patent
Hu et al.

(10) Patent No.: US 11,429,764 B2
(45) Date of Patent: *Aug. 30, 2022

(54) SYSTEM AND METHOD FOR ENERGY USAGE ACCOUNTING IN SOFTWARE APPLICATIONS

(71) Applicant: Purdue Research Foundation, West Lafayette, IN (US)

(72) Inventors: Yu Charlie Hu, West Lafayette, IN (US); Abhinav Pathak, San Jose, CA (US)

(73) Assignee: Purdue Research Foundation, West Lafayette, IN (US)

( * ) Notice: Subject to any disclaimer, the term of this patent is extended or adjusted under 35 U.S.C. 154(b) by 11 days.

This patent is subject to a terminal disclaimer.

(21) Appl. No.: 16/867,430

(22) Filed: May 5, 2020

(65) Prior Publication Data

US 2020/0334403 A1  Oct. 22, 2020

Related U.S. Application Data

(63) Continuation of application No. 15/994,617, filed on May 31, 2018, now Pat. No. 10,642,944, which is a continuation of application No. 13/859,690, filed on Apr. 9, 2013, now Pat. No. 10,013,511.

(60) Provisional application No. 61/760,038, filed on Feb. 2, 2013, provisional application No. 61/621,670, filed on Apr. 9, 2012.

(51) Int. Cl.
*G06F 30/20* (2020.01)
*G06F 11/30* (2006.01)
*G06F 11/34* (2006.01)

(52) U.S. Cl.
CPC .......... *G06F 30/20* (2020.01); *G06F 11/3062* (2013.01); *G06F 11/3409* (2013.01); *G06F 11/3466* (2013.01); *G06F 2201/865* (2013.01); *Y02D 10/00* (2018.01)

(58) Field of Classification Search
CPC .. G06F 30/20; G06F 11/3062; G06F 11/3409; G06F 11/3466; G06F 2201/865; Y02D 10/00
See application file for complete search history.

(56) References Cited

PUBLICATIONS

Wang et al. "SPAN: A software power analyzer for multicore computer systems". Sustainable Computing: Informatics and Systems 1 (2011) 23-34. (Year: 2011).*

* cited by examiner

*Primary Examiner* — Eunhee Kim
(74) *Attorney, Agent, or Firm* — Piroozi-IP, LLC

(57) ABSTRACT

A method for generating an energy usage profile for a software program executed in a computing device includes generating a call trace of an executed system call, identifying a first power consumption and duration of a first power state due to the first system call using a model, identifying a second power consumption and duration of a second power state based on the model, and generating an energy usage profile for the software program. The energy usage profile includes energy consumption of the computing device for the system call based on the first power consumption level multiplied by the first duration and the second power consumption level multiplied by the second duration associated an identifier for the call trace.

7 Claims, 8 Drawing Sheets

(a) Per-thread (b) Per-routine

SYSTEM AND METHOD FOR ENERGY USAGE ACCOUNTING IN SOFTWARE APPLICATIONS

CLAIM OF PRIORITY

This application claims priority to U.S. Provisional Application No. 61/621,670, which is entitled "Fine-Grained Power Modeling for Smartphones Using System Call Tracing," and was filed on Apr. 9, 2012, the contents of which are hereby incorporated in their entirety by reference. This patent claims further priority to U.S. Provisional Application No. 61/760,038, which is entitled "Fine Grained Energy Accounting on Smartphones with Eprof," and was filed on Feb. 2, 2013, the contents of which are hereby incorporated in their entirety by reference. This application is a continuation of U.S. patent application Ser. No. 15/994,617, now U.S. Pat. No. 10,642,944, entitled "System and Method for Energy Usage Accounting in Software Applications," filed on May 31, 2018, which in turn is a continuation of and claims priority to U.S. patent application Ser. No. 13/859,690, which is entitled "System And Method For Energy Usage Accounting In Software Applications," and was filed on Apr. 9, 2013, now U.S. Pat. No. 10,013,511, the contents of which are hereby incorporated in their entirety by reference.

TECHNICAL FIELD

This document relates generally to systems and methods for monitoring electrical power usage and energy consumption in electronic devices, and, more particularly, to systems and methods for identifying operations that are performed during execution of software programs that trigger components in the computing device to consume electrical energy.

BACKGROUND

In recent years, advances in digital computing hardware and software have resulted in a proliferation of mobile computing devices that come in a wide range of form factors including devices that are worn on the body of the user and handheld devices such as smartphones and tablets. Modern mobile computing devices incorporate numerous components including, but not limited to, single and multi-core central processing units (CPUs), graphical processing units (GPUs), random access memory (RAM), digital data storage devices such as solid-state drives (SSDs), radio transceivers that provide access to local area networks (LAN) and wide area networks (WAN), global positioning system (GPS) receivers, digital cameras, touch-input display screens, gyroscope and accelerometer sensors, and audio output devices. Mobile computing devices typically receive electrical power to operate the components from an integrated battery with a comparatively limited energy storage capacity. Thus, efficient operation of the components in the mobile computing device is important to extending the effective useful life of the device before the battery needs to be recharged or replaced.

In traditional computing applications, the CPU and more recently the GPU have been the predominant consumers of electrical power in the computing system. Existing techniques enable monitoring of the power for the CPU and GPU during operation of the computing system. In some embodiments, the CPU and GPU include integrated hardware power monitoring components that enable fine-grained reporting of the power consumption of the CPU and GPU based on the utilization rate of the components in the CPU and GPU. For example, a modern CPU typically includes multiple execution cores, cache, and peripheral components that are formed in a single integrated circuit. One or more of the cores in the CPU are utilized when executing program instructions, but a typical CPU also spends a large fraction of the time in an idle state where the entire CPU or various components in the CPU do not execute programmed instructions. Modern CPUs include dynamic clock speed adjustments, power gating, and other power control techniques that reduce the power consumption of the CPU when one or more components in the CPU are idle or utilized at less than full capacity. For example, in one operating mode a CPU with four execution cores executes a series of program instructions with a single CPU core while the remaining cores are idle. The CPU reduces the clock speed of the idle cores, and optionally deactivates the idle cores completely, while the active core consumes more power during execution of the program instructions. Power monitoring hardware in the CPU enables identification of the power consumption of components in the CPU with high precision based on the utilization of the different components in the CPU. Modern GPUs similarly include different power states based on utilization and include similar power monitoring capabilities. CPUs and GPUs in mobile devices are typically integrated in a single system on a chip (SoC) configuration and can be considered as a single device with different sub-components for power consumption monitoring in some embodiments. Existing software applications can retrieve information about the power consumption of the CPU and GPU and identify the power consumption of individual software programs with reference to the utilization rates of the CPU/GPU and the programs that utilize the CPU/GPU during operation.

While monitoring the power consumption in the CPU and GPU is useful in determining a portion of the energy consumption in a computing device, the CPU and GPU are only responsible for a fraction of the power consumption in a modern computing device. In all computing devices, and mobile devices particularly, the additional components in the computing device often consume a significant portion of the total system power in different operating modes. Some existing mobile devices include coarse-grained power consumption monitoring capabilities that enable identification of the aggregate power consumption for the entire mobile device, and some existing power monitoring solutions further monitor the aggregate energy consumption of individual components within the mobile device. Identification of the energy consumption of components in the computing device beyond the prior art techniques for measuring CPU power consumption during the execution of software programs would be beneficial. Additionally, fine-grained identification of the portions of a software program that consume energy during execution of the program would be beneficial.

SUMMARY

In one embodiment, a method for generating an energy usage profile for a software program that is executed in a computing device has been developed. The method includes executing program instructions corresponding to a first system call in a software program with a processor in the computing device, the processor operating a component in the computing device in response to execution of the first system call, generating a first call trace of the execution of the first system call with the processor, the generation of the first call trace including generating a first timestamp corresponding to a first time at which the first system call is executed and generating a first identifier including at least one of the group consisting of a calling routine identifier, a thread identifier, and a process identifier for the software program that executes the first system call, identifying a first power consumption level and a first duration of a first power state of the computing device in response to execution of the first system call based on a model stored in a first memory, identifying a second power consumption level and a second duration of a second power state after the first power state based on the model, generating an energy usage profile for the software program associating the first identifier with an estimate of energy consumption of the computing device in response to the execution of the first system call based at least in part on the first power consumption level, the first duration, the second power consumption level, and the second duration, and storing the energy usage profile in a second memory.

In another embodiment, a method for generating an energy usage profile in a computing device for a software program that is executed with the computing device has been developed. The method includes executing program instructions corresponding to a wake lock acquire system call in the software program with a processor in the computing device, a component in the computing device transitioning from a first power state to a second power state in response to the execution of the wake lock acquire system call, the second power state having a higher power consumption level for the component than the first power state, generating a first call trace of the execution of the wake lock acquire system call with the processor, the generation of the first call trace further including generating a first timestamp corresponding to a first time at which the wake lock acquire system call is executed and generating a first identifier including at least one of the group consisting of a calling routine identifier, a thread identifier, and a process identifier for the software program that executes the first system call, executing program instructions corresponding to a wake lock release system call in the software program with the processor in the computing device, the component in the computing device transitioning from the second power state to the first power state in response to the execution of the wake lock release system call, generating a second call trace of the execution of the wake lock release system call with the processor, the generation of the second call trace including generating a second timestamp corresponding to a second time at which the wake lock release system call is executed and generating a second identifier including at least one of the group consisting of a calling routine identifier, a thread identifier, and a process identifier for the software program that executes the second system call, generating an energy usage profile for the software program associating the first identifier and an estimate of energy consumption of the computing device in response to the execution of the wake lock acquire system call based at least in part on the power consumption level of the second power state and an elapsed time from the first timestamp to the second timestamp, and storing the energy usage profile in a memory.

In another embodiment, a system for generation of an energy usage profile for a program executed in a computing device has been developed. The system includes a memory configured to store programmed instructions corresponding to an operating system, programmed instructions corresponding to a user program, and data corresponding to a model of power states corresponding to a component in the computing device, a processor operatively connected to the memory, and a component connected to the processor to enable the processor to communicate with the component. The processor is configured to execute the programmed instructions corresponding to a first system call in the user program, the processor operating a component in the computing device in response to execution of the first system call, generate a first call trace of the execution of the first system call with the operating system, the processor being further configured to generate a first timestamp corresponding to a first time at which the first system call is executed and generate a first identifier including at least one of the group consisting of a calling routine identifier, a thread identifier, and a process identifier for the software program that executes the first system call, identify a first power consumption level and a first duration of a first power state of the computing device in response to execution of the first system call based on the model, identify a second power consumption level and a second duration of a second power state after the first power state based on the model, generate an energy usage profile for the software program associating the first identifier with an estimate of energy consumption of the computing device in response to the execution of the first system call based at least in part on the first power consumption level, the first duration, the second power consumption level, and the second duration, and store the energy usage profile in the memory.

DETAILED DESCRIPTION

Figure 1:
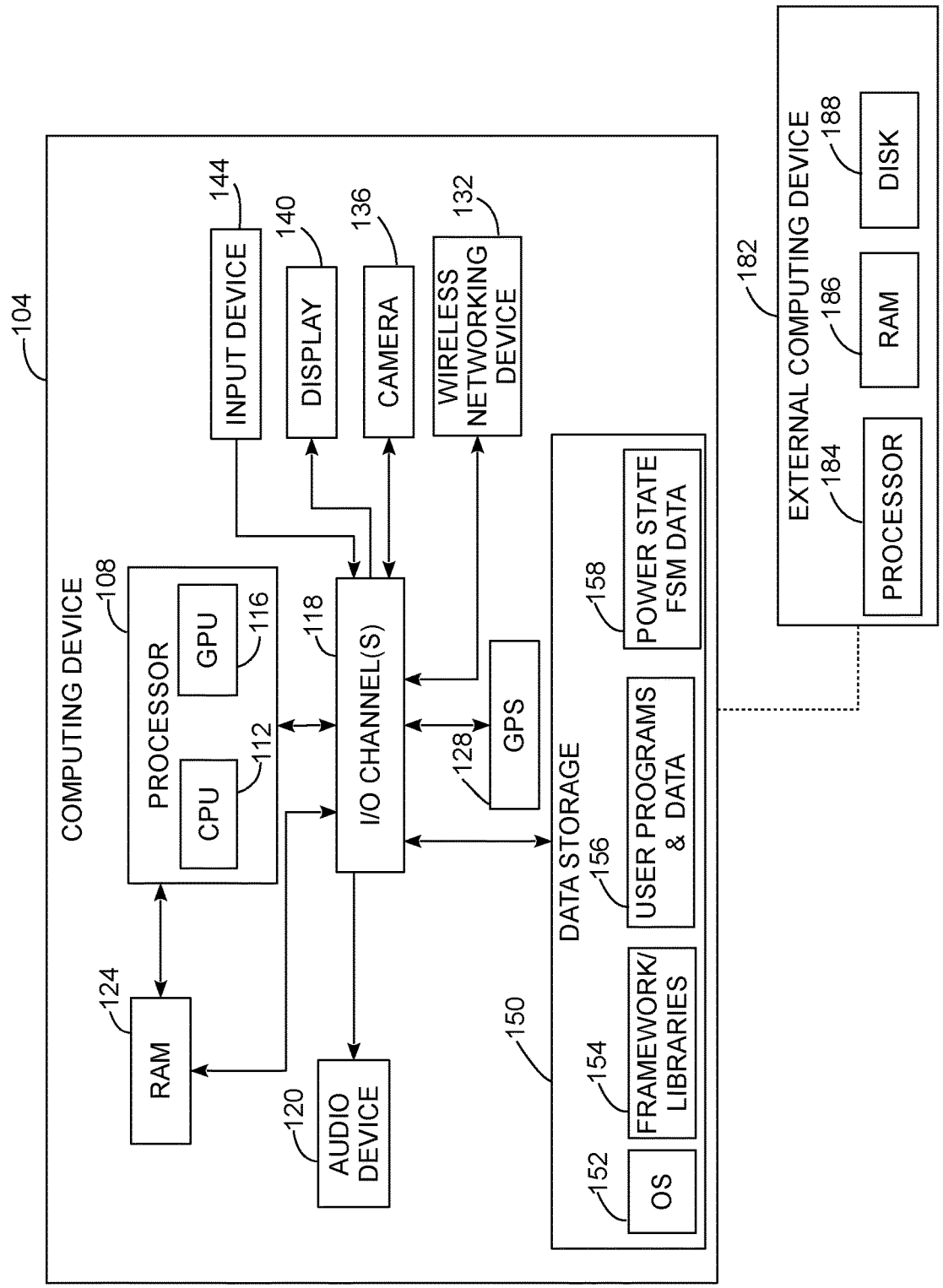
FIG. 1 is a schematic diagram of a mobile computing device that is configured to generate energy usage profiles for one or more software programs that are executed with a processor and components in the mobile computing device.

For the purposes of promoting an understanding of the principles of the embodiments described herein, reference is now be made to the drawings and descriptions in the following written specification. No limitation to the scope of the subject matter is intended by the references. This patent also includes any alterations and modifications to the illustrated embodiments and includes further applications of the principles of the described embodiments as would normally occur to one skilled in the art to which this document pertains.

As used herein, the term "system call" refers to any software command in a computing device that enables a program running in the computing device to send or receive data from or otherwise control the operation of one or more hardware components in the computing device. System calls are implemented by operating system (OS) software that controls access to hardware in the computing device through a software interface. For example, the Portable Operating System Interface (POSIX) and Windows Application Programming Interface (API) are two examples of system call interfaces. The term system call refers to a set of software functions that are "called" or invoked by the user level program to access lower-level frameworks and operating system services through a controlled interface. In many instances, user programs do not interact with system calls directly, but instead use higher layer libraries and software frameworks that wrap the functionality of system calls. For example, in versions of the Android operating system, user level software programs are executed inside of software virtual machines (VMs) that isolate the software programs and provide an underlying software framework for interacting with hardware components in the computing device. In versions of the Windows Phone operating system, some user level applications are executed in virtual machines, while other programs execute system calls using software libraries within a single operating system instance that is executed by the hardware of the computing device.

As used herein, the term "power state" refers to an identified level of power consumption of a single component or multiple components in a computing device during a mode of operation. For example, a wireless transceiver in a computing device operates in different power states when the wireless transceiver is idle, receiving data, sending data, or scanning for available wireless networks. In some power states, the power consumption of a component or the entire computing device vary within a range in a single power state, and a linear regression (LR) model or other estimation technique estimates the variations in power consumption in the power state. In some instances, a component operates in a power state at a level of power consumption and for a length of time that corresponds to one or more input parameters to a system call. For example, in the POSIX specification the "write" system call is used to write data to a file. A parameter in the write system call indicates the size of a data buffer that is to be written to the file. The write system call affects the power state of a data storage device, such as a solid-state disk (SSD) or other storage medium, and the size of the data to be written to the storage device affect the total energy consumption during the writing process and the length of the writing process.

As described in more detail below, in some instances, the computing device executes a system call that triggers the component to enter a "productive" power state followed by a "tail" power state. For example, a wireless network device sends packets of data and returns to an intermediate power state that is below the productive power state when sending the data packets, but above an idle state when the network device is not in use. The term "productive power state" refers to a power state that occurs during activity in a component that is performed in response to receiving the system call. A power state that occurs when a component in the computing device consumes power after the completion of the productive power states for a system call is referred to as a "tail" power state.

As used herein, the term "finite state machine" (FSM) refers to a model of operation for a computing device where the computing device operates in one of a plurality of states, and one or more events that occur during operation of the computing device precipitate transitions between the states. FSMs are used in a wide range of computing applications, and are described herein for use as a power consumption and energy usage model of a computing device during different modes of operation. In the power consumption and energy usage model, each state of the FSM corresponds to a power state for either the entire computing device or selected components in the computing device. The transitions between power states are triggered through invocation of system calls, completion of execution of system calls, and from transitions between tail power states that occur in response to the operation of different components in the computing device after nominal completion of the system call.

As is known in the art, the electrical power consumption of the computing device corresponds to the supply voltage (E) multiplied by the supply current (I). In many mobile electronic devices, the supply voltage E is held constant during operation of the device, and the level of electrical current varies as the device increases and decreases power consumption during operation. For example, some mobile computing devices receive power from lithium ion batteries that generate a supply voltage of 3.7 volts. In other embodiments, an electrical power supply includes multiple voltage rails that each provides electrical power at one of a plurality of constant voltage levels, such as 12 volts, 5 volts, and 3.3 volts, to different components in a computing device. Thus, the changes to the electrical power consumption in computing devices are sometimes referred to in terms of the electrical supply current. As is further known in the art, the energy consumption of the computing device is the integral of the power consumption over time. Thus, when the computing device operates in an identified power state for an identified time duration, the energy consumption corresponds to the level of power consumption in the power state multiplied by the time duration in the power state.

As used herein, the term "energy usage profile" refers to any record of any type of the energy consumption for an application including accounting information for the energy consumption of multiple program entities in the software application. A single software application is formed from multiple program entities that include processes, threads, and subroutines. Each process includes one or more execution threads, and each thread executes multiple software routines. The routines form a hierarchy where a parent routine invokes a child sub-routine and the child sub-routine further invokes additional child sub-routines in a recursive manner. The energy accounting data in the energy profile provides a detailed breakdown of the total energy consumption for a particular execution of a software program broken down into pieces that are associated with the individual program entities that are responsible for causing the energy consumption. The energy usage profile is stored in a memory for use with profiling software applications that generate human and machine-readable outputs to assist in monitoring, testing, and developing the software program that is executed to generate the energy usage profile.

As used herein, the term "memory" refers to any device or combination of multiple devices that are configured to store data for later retrieval by a processor. Memory includes volatile data storage devices such as static and dynamic random access memory (RAM) that are typically used for temporary data storage and caching in computing devices. Memory further includes any non-volatile data storage devices including, but not limited to, solid-state drives (SSDs), magnetic and optical disk drives, magnetic tapes, and the like. In the description below, any type of data including program data, FSM model data, system call and routine call tracing data, and energy usage profile data are stored in one or more memory devices after being generated using one or more digital processing devices. In some embodiments, different sets of data are stored in multiple memories in a single computing device or are spread between memories in multiple computing devices.

FIG. 1 depicts an illustrative embodiment of a computing device 104 that is configured to execute one or more software programs with system call tracing to generate an energy usage profile for different program entities of the programs including processes, threads, and calling routines in each program. The computing device 140 includes a processor 108 that is operatively connected to multiple components including an audio component 120, random access memory (RAM), global positioning system (GPS) receiver 128, wireless network component 132, camera 136, display device 140, input component 144, and data storage component 150 through one or more input-output (I/O) channels 118. As used herein, the term "component" refers to any circuit, device, or system within a computing device that consumes electrical power during operation and interacts with a processor in the computing device through an I/O channel that provides a unidirectional or bidirectional communication path for sending and receiving digital data with the processor and optionally with RAM. The illustrative embodiment of the computing device 104 includes components that are common to a wide range of computing devices including, but not limited to, desktop and notebook personal computers, smartphones, tablets, personal digital assistants (PDAs), wearable computing devices, and the like. Alternative computing device embodiments optionally omit some of the elements depicted in FIG. 1, and optionally include components that communicate with a processor through one or more I/O channels beyond the components that are illustrated in FIG. 1.

In the computing device 108, the processor 108 includes one or more central processing unit (CPU) cores 112 and a graphical processing unit (GPU) 116. In the computing device 104, the CPU 112 and GPU 116 are combined into a single integrated circuit in a system on a chip (SoC) configuration. The CPU includes one or more execution cores that implement a general-purpose instruction set including, but not limited to, instruction sets from the x86, ARM, MIPS, and POWER families. The GPU includes computational units including fixed-function and programmable shader processors, geometry and rasterization engines that enable generation of 2D and optionally 3D graphics through the display component 140 using, for example, the OpenGL or Direct 3D application programming interfaces (APIs). The CPU 112 and GPU 116 optionally share hardware resources and in some embodiments, the GPU 116 also performs computational tasks that are unrelated to the generation of graphics using, for example, the OpenCL API. In an alternative embodiment, the CPU and GPU communication through an external I/O channel such as the PCI express (PCIe) data bus standard. As described in more detail below, the processor 108 is responsible for execution of stored program instructions implement in an operating system, software frameworks and system libraries, and user level program instructions. The processor executes system calls that enable user level programs to invoke the operating system to access components in the computing device 104 through one or more of the I/O channels 118.

In the computing device 104, the audio component 120 is typically a digital signal processor (DSP) in association with filters, amplifiers, speakers and other hardware and software components that enable the computing device 104 to generate audio output signals. In one embodiment, the processor 108 executes one or more software programs to decompress and decode audio data into a pulse-code modulated (PCM) format or other suitable format for audible output of music, voice, and other sounds through the audio output component 120.

The random access memory (RAM) 124 stores program data for executing programs as well as data corresponding to user files and temporary system data. RAM is typically a volatile memory module that does not retain information after the removal of electrical power from the computing device 104. The processor 108 uses the RAM 124 for temporary data storage during operation in addition to smaller memory caches that are typically incorporated with the CPU 112 and GPU 116. The RAM 124 is commonly used to store data that are read from the data storage component 150 and held within a memory buffer for use by the OS and software applications. As described below, system calls that nominally interact with the data storage component 150 actually read or write buffered file data stored in the RAM 124 for some files that are temporarily held in the memory buffer.

The global positioning system (GPS) receiver 128 includes a radio receiver and antenna that are typically configured to receive timing signals from multiple orbiting satellites to identify a geographic location of the computing device 104 and optionally identify a rate and direction of travel for the computing device 104. In alternative embodiments, the GPS includes additional radio receivers that receive signals from terrestrial radio transmitters, and some GPS embodiments further include compasses, altimeters, accelerometers, and gyroscopes that provide inertial navigation services in addition to receiving signals from external navigation systems. In some embodiments, the processor 108 requests geographic coordinates, such as latitude and longitude coordinates, from the GPS 128, and the GPS 128 caches the response for a brief time. Thus, the GPS 128 enters a higher power state to identify the location of the computing device 104 when no location coordinate data have been requested for a predetermined period of time, but the GPS 128 sends cached location coordinate data in response to a subsequent request that occurs within a predetermined length of time.

The wireless network component 132 includes one or more radio transceivers that implement wireless local area network (WLAN) and wireless wide area network (WWAN) functionality. Examples of WLAN transceivers include transceivers that implement the Bluetooth and the IEEE 802.11 (Wi-Fi) families of protocols. Examples of WWAN transceivers include transceivers that implement the GSM, CDMA, UMTS, LTE, EDGE, EVDO, WiMAX and other WWAN standards that enable wireless and voice and data communication. In a mobile computing device configuration, the computing device 104 sends and receives wireless data packets via the wireless component, which implements the physical layer of the network protocol stack that is implemented with the operating system software in the computing device 104. The wireless network component 132 optionally implements telephony using GSM and CDMA protocols that interface with a cellular telephony network. In mobile computing devices, the wireless network components often consume large amounts of electrical power. Many wireless network components transition between multiple power states to reduce power consumption when the wireless transceiver is idle or operating at low data rates, while increasing power consumption to operate at higher data rates.

The camera 136 is typically a digital camera that generates still photographs or video data in response to commands received from the processor 108. In some embodiments, an illumination source such as a flash, light, or infrared illuminator provides artificial illumination for the camera. The camera 136 typically draws minimal power when deactivated, but the camera and associated illumination sources may draw substantial power over short periods for still photographs, or for longer periods when generating videos.

The display component 140 includes one or more devices that produce graphical displays of text, pictures, video, and graphical user interfaces (GUIs) for controlling programs in the computing device 104. In a mobile computing device, the display component 140 typically includes a backlit liquid crystal display (LCD) or an organic light emitting diode (OLED) display component. The majority of power consumption associated with the display component 140 is associated with generating an active emission of light to enable a user to view the display. In an LCD embodiment, a backlight such as an array of light emitting diodes (LEDs) generates the light. In an OLED panel, individual organic LED pixels emit light to form a visible display. The amount of energy consumption for the display component 140 varies based on the amount of time when the display 140 emits light and the brightness of the display output.

The input component 144 includes touch input components such as capacitive and resistive touch interfaces that are integrated with the display 140, and other input modes including, but not limited to, buttons, dials, switches, keyboards, mice, touch pads, gesture input, and voice input components. The input component 144 enables the user to enter input to control the operation of one or more software programs in the computing device 104.

The data storage component 150 is a non-volatile digital data storage component that stores operating system (OS) data 152, framework and system library code 154, program and user data 156, and power state FSM model data 158. In a typical mobile device, the data storage component 150 is a solid-state memory component such as a solid-state drive (SSD) that is employs NAND flash or another memory storage technology that is adapted to use in mobile applications. Personal computer (PC) computing devices typically use one or more solid-state, magnetic disk, or optical disk data storage components.

The user programs and data 156 include a wide range of software programs that are installed by a user for execution by the computing device 104. User data 156 also include data files such as photographs, videos, audio files, word processing documents and spreadsheets, databases, stored email and text messages, and any other data that the user of the computing device views or manipulates using the software programs in the computing device 104. The power state FSM model data 158 include stored power state and power state transition FSM models that are generated using an empirical training process using the hardware components and software that are installed on the computing device 104. Generation of the FSM models occurs prior to execution of user programs 156 and generation of the energy usage profiles for the user programs 156.

The operating system (OS) data 152 includes binary executable code that implements an operating system kernel and hardware driver software that enables the OS to control the operation of the various hardware components in the computing device 104. In the context of mobile computing devices, common embodiments of the OS software 152 include variants of the Windows CE and Windows NT kernels (used in versions of Windows Mobile OS and Windows Phone OS), the Linux kernel (used in the Android OS), and the XNU kernel (used in Apple iOS). As used in this document, the "OS" software 152 refers to kernel-level software that implements the system calls used by higher-layer programs in addition to other services that are separated from user-level software programs through kernel interfaces. In some software configurations, the OS software 152 also provides services for the generation of multiple "virtual machines" (VMs) that further isolate higher-level programs. Other portions of an "operating system" are often referred to more broadly to include framework code 154 such as system libraries, graphical user interface (GUI) toolkits, input interface libraries, and the like. The framework code 154 interfaces with the kernel services provided by the OS code 152, but the processor 108 executes the services and library functions in the framework 154 as part of the user memory space that includes higher-level user programs 156. For example, a web browser executed on a smartphone is a user level program 156 that typically use integrated libraries and services such as HTML and JavaScript engines in the framework program code 154. The framework program code 154 includes invocations of system calls to request services from the OS 152. In another embodiment, the user programs 156 can bypass the framework code 154 to invoke system calls with the OS 152 directly.

In the embodiment of FIG. 1, both the OS data 152 and framework code 154 are instrumented to enable precise tracing of the execution of system calls and associated software functions in the computing device 104. As used herein, the term "instrumentation" as applied to the OS and framework code 154 refers to any software instructions that enable monitoring and recording of the execution of system calls including, the identity of a system call, a time at which a system call is invoked, the data parameters that are passed to the system call, any data that are returned from the system call, and a call trace of the software function, thread, and process that invoked the system call, including a log of previous system calls that may have been made in conjunction with the traced system call. Various forms of instrumentation including thunking, operating system level tracing services such as dtrace and SystemTap, debugging utilities like strace, and program profilers can be used to instrument the OS data 152 and framework code 154.

Figure 10:
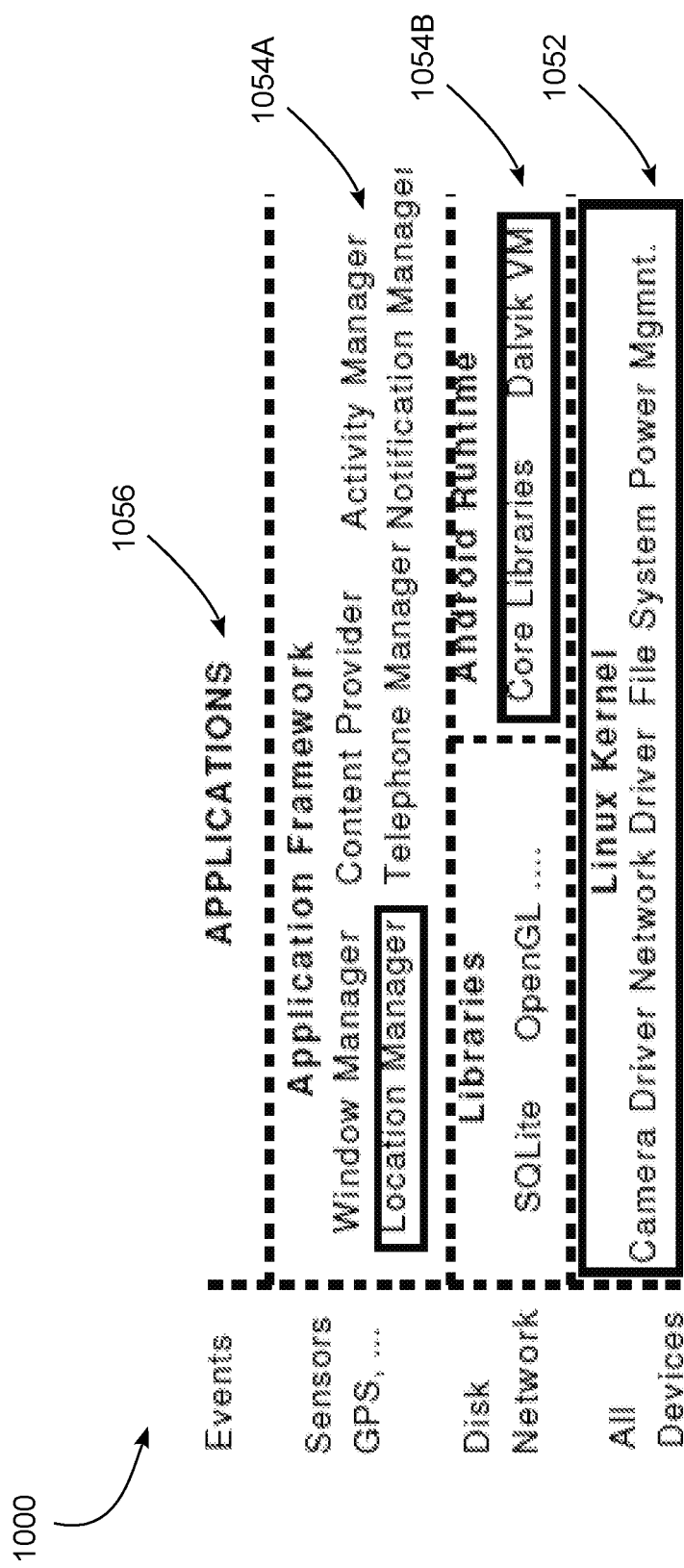
FIG. 10 is a diagram depicting software components and instrumented software components in a computing device for tracing of system call execution in a computing device.

FIG. 10 depicts software components 1000 in an embodiment of the Android operating system including user applications 1056, the Android application framework services 1054A, libraries and the Android runtime 1054B, and the Linux Kernel OS layer 1052. In the example of FIG. 10, the Location Manage service in the Android application framework services 1054A, core libraries and the Dalvik virtual machine (VM) 1054B, and portions of the Linux Kernel 1052 are instrumented to identify system calls that are related to queries for location data from the GPS receiver 128. In the example of the Android system, the Linux Kernel is instrumented to provide low-level information about the system calls that are invoked to access the GPS device, and the higher level Android libraries and VM 1054B and Location Manager services 1054A are instrumented to enable identification of the precise calling thread, process, and function in the user application 1056 that makes the request for GPS data.

In the Android system, the user-level applications rarely invoke system calls directly. Instead, the application invokes calls to frameworks, services, and lower level libraries that mask the complexity of the lower-layer system call interface and enable higher-level programs to interact with a large number of hardware components, such as different GPS receiver models, without requiring specific code for each hardware component model. The instrumentation of the OS and the software framework stack enables precise tracing of system calls and synchronization of system call execution with the monitored power consumption in the computing device 104 that is used to generate FSM models for estimation of power and energy consumption in the computing device 104.

In the computing system 104, the I/O channels 118 communicatively couple the processor 108 to the other components in the computing device to enable the processor 108 to operate the components and send/receive data from the components. For example, the processor 108 typically includes a memory controller that enables the processor 108 to send addressing, read, and write commands to the RAM 124 through electrical traces that are formed in a printed circuit board. The processor 108 uses other standardized I/O channels including, but not limited to, the peripheral component interconnect (PCI), PCI express, $I^2C$, Universal Serial Bus (USB), IEEE 1394 (Firewire), serial AT attachment (SATA), small computer system interface (SCSI), and Ethernet I/O channels to communicate with various components in the computing device 104. In the computing device 104, many system call operations include reading or writing data in the RAM 124 to one or more of the components through the I/O channels 118. As depicted in FIG. 1, the RAM 124 is communicatively connected to the components through the I/O channels 118 using, for example, direct memory access (DMA) or other communication techniques that enable direct communication between the RAM 124 and components in the computing device 124 with little or no interaction with the CPU 112 in the processor 108. Thus, in some system calls the processor 108 performs a minimal amount of processing to arbitrate access between components and the RAM 124 to perform the direct memory access, but the data transfer occurs independently from the operation of the processor 108.

In addition to the computing device 104, FIG. 1 depicts an optional external computing device 182. The external computing device 182 includes an independent processor 184 along with a memory including RAM 186 and a non-volatile disk 188. One example of an embodiment of the external computing device 182 is a personal computer (PC) that runs an operating system and user software programs. In one configuration of the processes that are described below, the computing device 104 executes a program, generates a power usage profile, stores the power usage profile in a memory such as the RAM 124 or data storage device 150, and generates additional output for a user to view the energy usage profile. In another configuration, the computing device 104 performs a portion of the processing described above, such as executing the user program and generating the system call trace data for storage in the memory. The external computing device 182 retrieves the system call trace data and generates the energy usage profile using additional software executed with the processor 184. The external computing device 182 stores the same FSM model data 158 that are depicted in the computing device 104 in the RAM 186 or disk 188. In yet another configuration, the computing device 104 and the processor 108 and other components in the computing device 104 are simulated in a virtualized environment within the external computing device. References to processors, memories, components, software, or any other elements that are used in the generation, storage, and analysis of energy usage profiles are understood to be non-limiting examples and that a wide range of hardware and software embodiments can be used with the processes described below.

Figure 2:
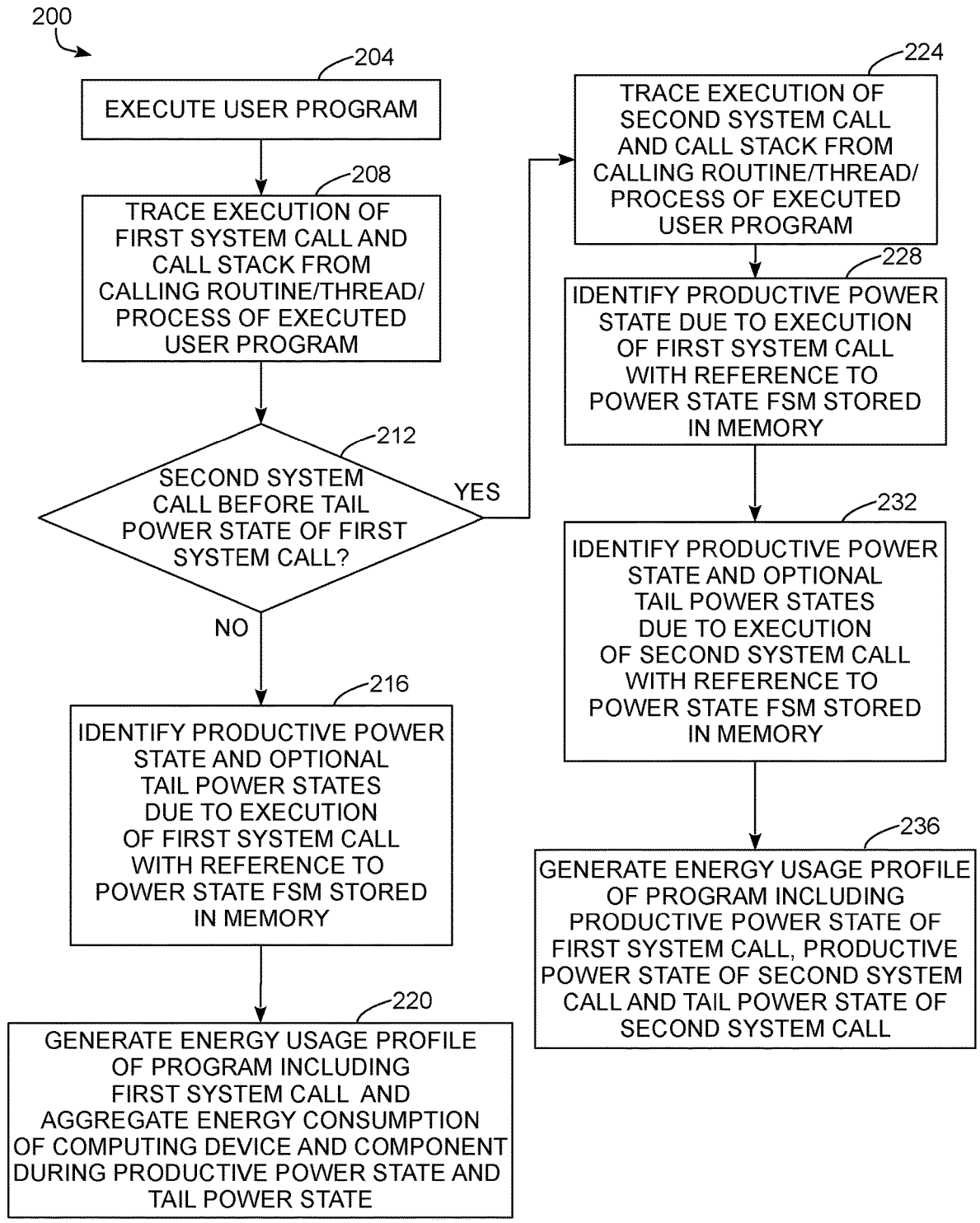
FIG. 2 is a block diagram of a process for generating an energy usage profile of an application that executes system calls.

FIG. 2 depicts a diagram of a process 200 for generating an energy usage profile for a computing device. In the discussion below, a reference to the process 200 performing a function or action refers to a processor executing programmed instructions stored in a memory to operate one or more components in a computing device to perform the function or action. Process 200 is described in conjunction with the computing device of FIG. 1 for illustrative purposes.

Process 200 begins as the computing device 104 executes a user program (block 204). The processor 108 loads user program data 156 from the data storage component 150 and executes instructions in the program data to run a program. While user programs cover a very wide range of functions, in a mobile computing device, many programs generate a graphical user interface (GUI) using the CPU 112 and GPU 116 to present graphics through the display 140. Many of the programs executed in the a mobile computing device include system call software instructions for the processor 108 to control the operation of one or more of the components through the I/O channels 118. The processor 108 executes programmed instructions, which include the system calls and other programmed instructions in the user program, with the underlying software frameworks and libraries 154 and OS 152. During execution of the program, the processor 108 consumes energy as the processor 108 executes programmed instructions, and one or more components in the computing device consume energy in response to system calls from the processor 108. The power consumption and energy accounting of the processor 108 while executing programmed instructions is measured using existing hardware and software techniques during execution of the program and is not described in further detail herein. However, the components in the computing device 104 that perform functions in response to system calls also consume energy and the process 200 generates estimates of the energy consumption of the components and identifies specific program entities of processes, threads, and software routines that result in the consumption of energy during the program in process 200.

Process 200 continues as the computing device 104 executes a first system call in response to an operation in the user program, and the computing device 104 traces the execution of the system call (block 208). As described above, both the framework and library software 154 and the OS software 152 implement instrumentation to trace the execution of the first system call. The tracing process generates a record including an identifier of the process, thread, and the call stack, which contains the sequence of dependent subroutine calls from the user program that led to the invocation of the system call, a timestamp when the call is executed, and a record of any data parameters that are passed to the system call. Many user programs do not invoke the system call directly, but instead invoke one or more system calls indirectly through calls to libraries and services that are provided by the software frameworks 154. In the computing device 104, the user programs 156 do not require modification of binary or interpreted program data for tracing the execution of system calls, although programs that are compiled with debugging symbols or other instrumentation can be executed during process 200.

Logging the call stack enables energy accounting for individual routines and a recursive hierarchy of calling routines using both exclusive and inclusive energy accounting. Exclusive energy accounting refers to an accounting of the energy consumption within a single routine due to executed software instructions and system calls that are executed in the routine, but not in child routines. Inclusive energy accounting refers to an accounting of the energy consumption within a single routine due to executed software instructions and system calls in addition to the aggregate energy consumption from calls to child routines.

During execution of the program, a second system call may be executed concurrently to the first system call or after the first system call prior to a tail power state that occurs due to the operation of a component in the computing device 104 that consumes energy due to the first system call and the second system call (block 212). If only the first system call occurs within the amount of time required for the productive power state and tail power state for the first system call, then process 200 generates estimates of the energy consumption of the computing device 104 in both the productive state and the tail state with the energy consumption being attributed to the element in the user program that generated the first system call (block 216).

Figure 5:
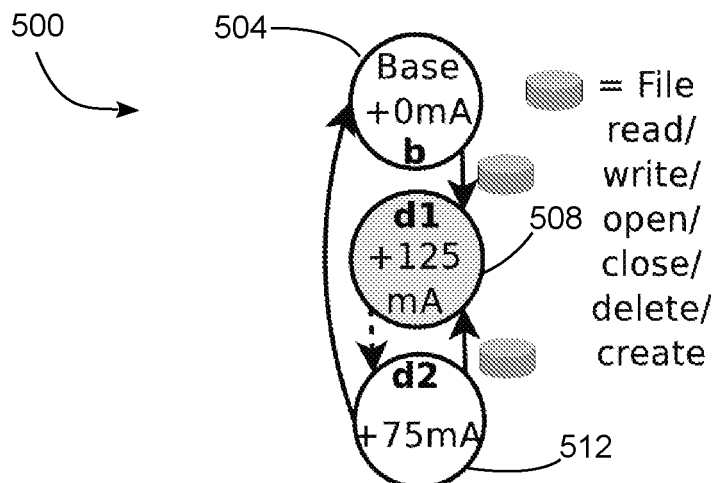
FIG. 5 is a diagram of a finite state machine (FSM) model for different power states associated with a data storage component in a computing device.

For example, using the data storage component 150 as an example, if the first system call is a read system call, then the computing device 104 reads data from a file, such as a user data file 156, that is stored on the data storage component 150. FIG. 5 depicts a graph of an FSM model including a base power state 504 (b), productive power state 508 (d1) and tail power state 512 (d2) for the computing device 104 before, during, and after execution of the read system call. During process 200, the read system call produces a transition to the productive power state 508 (d1) when the computing system 104 consumes additional power during the read system call. In one embodiment, FSM model 500 includes a linear regression function to estimate the duration of the productive power state 508 with reference to parameters that are passed to the read system call, such as the number of bytes that are requested in the read system call. After the expiration of the productive power state 508, the FSM includes a transition to the tail power state 512 for a predetermined duration that is measured empirically for the data storage device 150. If no other system calls trigger a return to the productive power state 508, then the computing device 104 returns to the base power state 504 after the tail power state 512 expires.

Figure 6:
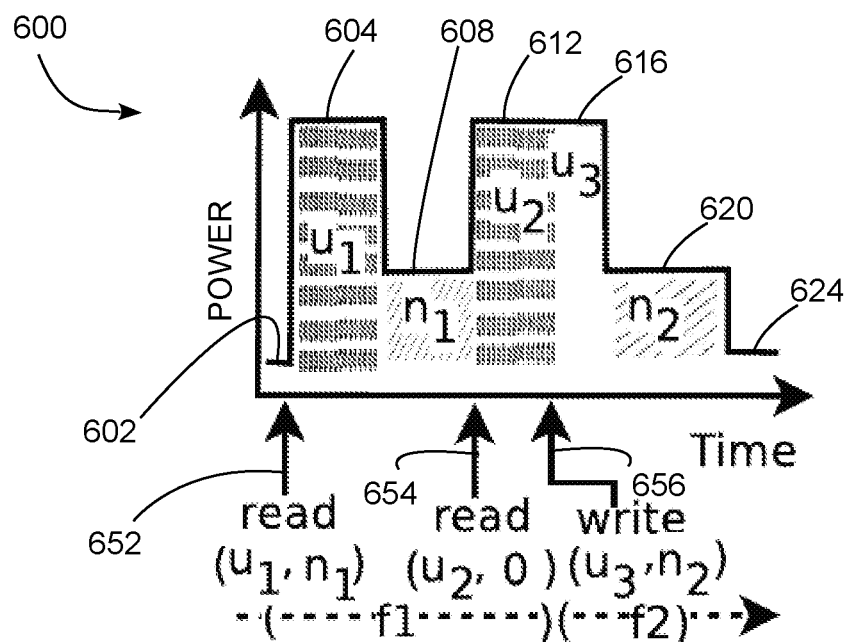
FIG. 6 is a diagram of power state transitions and durations of power states during execution of a series of system calls that interact with a component in a computing device.

FIG. 6 depicts a graph 600 of estimated time states during the execution of system calls that interact with the data storage component 150 using the FSM model 500 depicted in FIG. 5. In FIG. 6, the power levels 602, 604, and 608 of the graph 600 depict the base power state, productive power state, and tail power state, respectively, that are associated with the system call 652 during the processing described with reference to block 216. In the illustrative example described above, the system call 652 is responsible for both the productive power state 604 and the tail power state 608, and no other system calls are executed concurrently to the productive power state 604 or tail power state 608. In the example of FIG. 6, the tail power state 608 does not transition back to the base power state before the execution of the next system call 654 that interacts with the data storage device 150. During process 200 the energy usage estimate produced for the first system call includes the actual duration of the tail power state 608 multiplied by the power usage in the tail power state from the FSM model. Thus, the process 200 enables fine-grained accounting of the energy usage associated with a system call for the energy consumption during the entire tail power state or only a portion of the tail power state prior to transition to another power state.

Referring again to FIG. 2, the process 200 includes generation of an energy usage profile output that includes the identified energy usage in the productive power state and the tail power state in association with the system trace data associated with the first system call (block 220). The energy profile includes the routine that is identified in the call stack responsible for invoking the system call. Since each subroutine is part of a larger hierarchy of routines in a call stack that is part of a thread and is further part of a process, the energy profile also includes an identifier for the parent routines, thread, and process that are responsible for the energy consumed due to the execution of the system call. In one embodiment, the energy profile includes a separate accounting for the energy consumption of the components in the computing device that are associated with the productive power state and the tail power state of the component. For example, energy usage profile includes a separate accounting for the energy usage during the productive power state 604 and the tail state 608 for the system call 652 in FIG. 6. Thus, the process 200 generates a detailed estimate of energy consumption for components in the computing device 104 and associates the energy usage estimates with identifiable program entities of the user program to provide a detailed analysis of the portions of the user program that consume energy during operation. The energy usage profile is stored in a memory, such as the data storage component 150 or a memory of an external computing device, for use in analyzing the energy consumption of the user program and for modification of the user program to reduce energy consumption.

During process 200, if a second system call that interacts with the same component in the computing device 104 as the first system call occurs during the productive or tail power states of the first system call (block 212), then the generation of the energy profile changes to adjust the levels of energy consumption that are assigned to each of the first and second system calls during process 200. Process 200 continues with generation of a trace for the second system call (block 224). The computing device 104 generates the trace for the second system call in the same manner as described above with reference to the generation of the trace for the first system call in block 208.

Referring again to FIG. 6, the graph 600 includes a transition to the productive power state 612 corresponding to execution of the system call 654 in a situation when a subsequent system call 656 is executed while the component remains in the productive power state. For example, in FIG. 6, the system call 654 is a read system call with a productive power state 612, and the system call 656 is a write system call with a productive power state 616 that occurs immediate after productive power state 612. The tail power state 620 occurs after the transition from the productive power state 616 for later write system call 656, and the computing system 104 returns to the base power state 624 after the expiration of the tail power state 620. As depicted in FIG. 6, both the system call 654 and the system call 656 operate the data storage component 150, which consumes energy in the productive power states 612 and 616. The tail power state 620, however, also consumes energy and as described below, the illustrative embodiment of the process 200 assigns the power consumption of the tail state to the system call 656.

Referring again to FIG. 2, process 200 continues with identification of the productive power state corresponding to the first system call (block 228) and identification of the productive power state corresponding to the second system call, where the tail power state that occurs after the productive power states for both the first and second system calls is assigned to the second system call (block 232). In the computing device 104, the FSM model data 158 are used to estimate both power levels and durations for the productive power states of each of the first and second system calls with the durations optionally being estimated using the predetermined linear regressions identified for the component and the system call parameters. Note that in the illustrative embodiment of the process 200, the energy consumption of the tail power state is associated with the second system call instead of with the first system call or being fractionally divided in half between the first system call and the second system call. In alternative embodiments, however, another policy for assigning the tail energy either entirely to the first system call or partially to both the first and second system calls is used.

Process 200 continues with generation of an energy usage profile output that includes the identified energy usage in the first productive power state in association with the trace of the first system call and the second productive power state and tail power state in association with the system trace of the second system call (block 236). The energy profile is generated and stored in a memory in the same manner as described above with reference to the processing of block 220. The energy usage profile includes the accounting information that assigns the energy usage during the first productive power state to the first system call, and assigns the second productive power state and the tail state to the second system call invocation. Thus, when two or more system calls that interact with a component in the computing device are executed concurrently or sequentially with minimal delay, the final system call in the sequence is assigned the tail energy consumption in the energy profile.

As described above, the execution of a user program including the traced system calls occurs prior to generation of the energy profile for the program in one embodiment. The user program performs normal functions to generate a profile including the identified levels of energy consumption for system call patterns that are commonly executed while running the program. In the illustrative embodiment of FIG. 1 and FIG. 2, the computing device 104 executes the user program and includes the stored power state FSM model data 158 that are used to estimate the energy consumption of the system calls in the program and assign energy usage accounting information to the individual program entities in the user program. In another embodiment, an external computing device receives the system call trace data from the computing device 104 to generate the energy usage profile with the FSM model data. For example, if the computing device 104 is a smartphone that executes the user program, then a software development system such as a standard PC retrieves the system call and subroutine trace information after execution of the program and the development PC generates the energy usage profile. The PC stores the energy usage profile in a local memory or transmits the energy usage profile to the smartphone for storage in a memory within the smartphone. The PC or the smartphone generate visual display outputs including, for example, text and graphics depicting the energy usage information for identified program entities in the user program, such as individual calling routines, threads, and processes that consume energy due to system calls to the components other than the processor 108 in the computing device 104. In the computing device 104, the display 140 generates text and graphics depicting the energy usage information for system calls in the energy usage profile. The energy usage profile enables software developers and end users to identify portions of the user program that consume large amounts of energy and modify the execution code of the program or usage patterns of the program to reduce the energy consumption.

Process 200 is described above for generation of the energy usage profile for a single system call or two concurrent system calls for illustrative purposes. Many programs include the execution of a much larger number of system calls including concurrent system calls that interact with one or more components in the computing device. The output energy usage profile is generated in a similar manner to the illustrative example of process 200 to enable identification of sections in the software program that result in increased energy consumption. In many programs, a comparatively small section of the program, which can be referred to as a "hotspot," consumes a disproportionately large amount of energy due to interaction with hardware components in the computing device. Traditional utilization based energy monitoring techniques fail to identify hotspots that occur due to system call I/O with different components in the computing device because the system calls accessing I/O components often require minimal utilization of the computational resources in the processor 108, and I/O components after being actively used can stay in tail power state, which is not captured in utilized-based energy monitoring techniques.

During the operation of the computing device 104, the some system calls may be executed concurrently. In modern computing devices, the processor 108 is designed for execution of multiple instructions concurrently using, for example, superscalar, very long instruction word (VLIW), multiple processing cores, and simultaneous multithreading. The OS software 152, framework and library software 154, and user programs 156 include software functionality that implement multiple processes, multithreaded code execution within a process, and software concurrency facilities, such as mutexes and semaphores, that enable concurrent execution of software instructions and system calls during operation of the computing device 104. Concurrent software execution presents additional complexities for the generation of energy profiles because a single component in the computing device can enter a productive power state and remain in the productive power state for a continuous time span to service multiple concurrent system calls.

Figure 3:
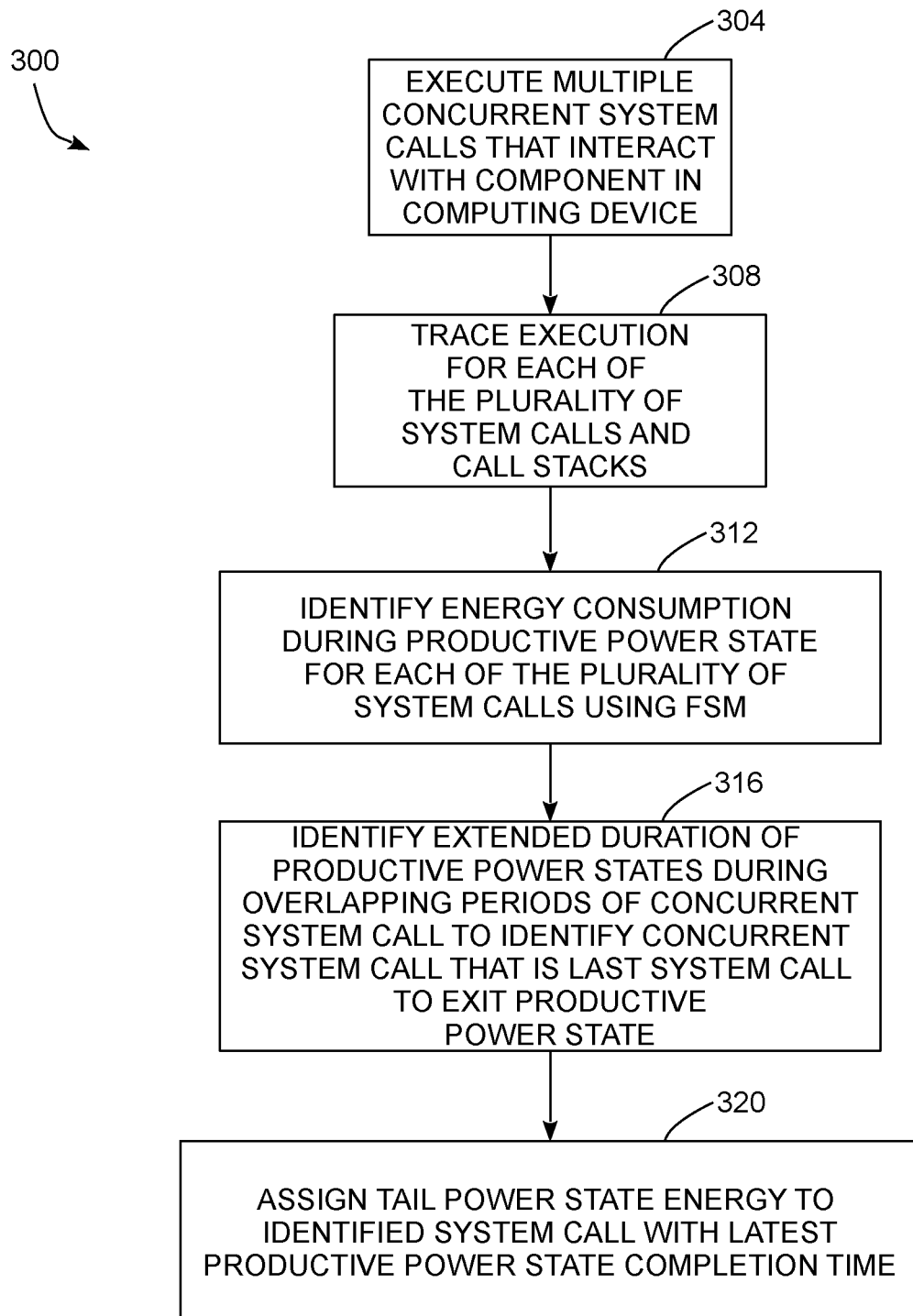
FIG. 3 is a block diagram of a process for assigning portions of total estimated energy consumption for a component in a computing device to multiple system calls during concurrent productive power states for the system calls.

FIG. 3 depicts a process 300 for dividing the energy usage of an extended productive power state amongst multiple system calls that are executed during the extended productive power state. Process 300 is performed in conjunction with the process 200 to generate an energy usage profile for the user program. Process 300 uses the system call traces and identified power states from the FSM model data that are generated during process 200 to identify when multiple system calls that interact with a component in the computing device 104 are executed concurrently. In the discussion below, a reference to the process 300 performing a function or action refers to a processor executing programmed instructions stored in a memory to operate one or more components in a computing device to perform the function or action. Process 300 is described in conjunction with the computing device 104 of FIG. 1 for illustrative purposes.

Process 300 begins with execution of multiple concurrent system calls that interact with a component in the computing device 104 (block 304). In the computing device 104, the processor 108 executes concurrent system calls corresponding to instructions from a user program stored in the user program data 156 in the data storage component 150. The instrumented OS software 152 and framework and libraries 154 generate system call and call stack traces for the concurrent system calls (block 308).

The process 300 generates an estimated energy consumption during the productive power state for each of the plurality of system calls using the FSM model data 158 to identify the power consumption level in the productive power state for the component and the estimated duration of each system call during the productive power state (block 312). As described above, the duration of the productive power states are identified with reference to the values of data parameters that are passed to the system calls and the linear regressions for the productive power states in the FSM model data 158. Thus, during process 300 the estimated energy consumption for each system call in the productive power state is generated with the same value as if each system call were executed individually instead of concurrently with the other system calls. As described above, however, the energy in the tail power state is typically assigned to one of the concurrent system calls that is the last system call to exit the productive power state. Due to contention between multiple system calls that each access a single component in the computing device 104, the extended duration of the productive power state increases when multiple system calls are in the productive power state.

Process 300 identifies time periods when the productive power states of multiple system calls overlap and extends the durations of the productive power states to identify which one of the concurrent system calls is the last system call to exit the productive power state (block 316). The system call trace includes the timestamp corresponding to when each of the system calls is executed, and the process 300 identifies the extended durations of the active power states based on the overlap between the concurrent system calls. During time periods of overlapping productive power states, the duration of the productive power states is increased by a factor corresponding to the number of concurrent system calls. For example, during a period when one system call is executed, the duration of the power state simply corresponds to the linear regression for the system call from the FSM model. When two system calls are in the productive power state concurrently, the effective duration of the productive power states for each system call is doubled during the overlapping time period to identify an extended time duration for both power states. The doubling of the effective duration corresponds to the progress of each system call in the productive power state being divided by two since two system calls are contending for shared resources in a single component in the computing device 104. Note however, that the total energy consumption for the two system calls during the productive power state is not doubled, but remains unchanged from the estimated productive power state energy consumption that occurs when each system call is executed individually instead of concurrently. In one embodiment the estimation of the power consumption during the overlapping time periods of the two system calls is divided by two so that the total energy consumption remains unchanged. Similarly, when three system calls are in the productive power state concurrently, the duration of the system calls during the overlapping time period is extended by a factor of three. Since the productive power states of system calls rarely overlap perfectly, the total duration of each system call in the productive power state is identified in a piece-wise manner during intervals where different numbers of system calls are in the productive power states concurrently.

Figure 7:
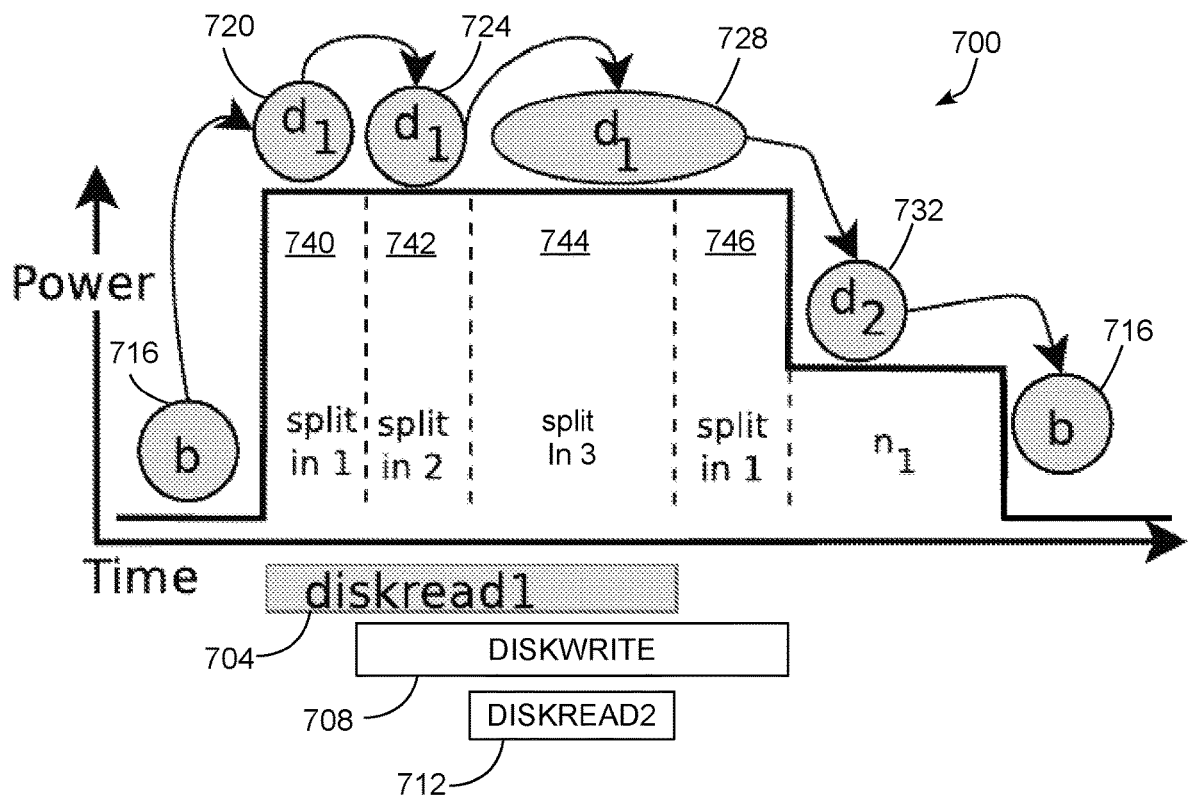
FIG. 7 is a diagram of power states for a data storage component in a computing device during execution of multiple concurrent system calls that read and write data to the data storage component.

FIG. 7 depicts an exemplary graph 700 depicting power states corresponding to the execution of three concurrent system calls that interact with a data storage component (disk). In FIG. 7, a read system call 704 begins first followed by an overlapping write system call 708 and a third read system call 712. The three system calls partially overlap in time during concurrent accesses to different files that are stored on the data storage device 150, although in the example of FIG. 7 the productive power states for the three system calls 704-712 have different durations and do not begin and end at the same time. In the graph 700, the power consumption increases from the base state 716 to a productive power state depicted by the state transitions 720, 724, and 728. The productive power states 720-728 depict the total productive power state time for each of the concurrent system calls 704-712 beginning with the first system call 704 and ending with completion of the productive power state for the third system call 708. As described above, the durations of the productive power states for the individual system calls 704-712 are affected by the overlapping time periods during which two or all three of the system calls are executed concurrently. In the example of FIG. 7, the data storage device 150 consumes power at a constant level during the productive power state even when performing read/write operations in response to the system calls 704-712.

In FIG. 7, the system call 704 enters the productive power state first during interval 740, and continues in the productive power state concurrently with the system call 708 during time interval 742, and with system calls 708 and 712 during time interval 744. Thus, the durations of the system calls 704, 708, and 712 in FIG. 7 are referred to as "extended durations" because the effective duration of the productive power state for the concurrent system calls are longer than the durations that are identified in the FSM model for the productive power states of the system calls. Similarly, the extended durations of the productive power states for the system calls 708 and 712 are increased due to the overlapping time intervals 742 and 744. In the example of FIG. 7, the productive power state of the system call 708 lasts through the intervals 742, 744, and 746. Thus, even though the system call 708 enters the productive power state before the system call 712, the process 300 identifies that the system call 708 is the final system call to exit the productive power state due to the extended duration of the productive power state for the system call 708 due to the concurrent execution with the system calls 704 and 712.

Referring to FIG. 3 and FIG. 7, process 300 continues with assignment of the energy consumption in the tail power state to the system call and calling stack that is last to exit the productive power state after execution in the energy usage profile (block 320). In the example of FIG. 7 above, the energy consumption in the tail power state 732 is assigned to the system call 708 in the energy usage profile because the system call 708 exits the productive power state after the system calls 704 and 712. In a situation where two or more system calls exit the productive power state simultaneously, the process 300 optionally divides the energy consumption of the tail power state between the system calls.

As described above, during execution of a software application the processor 108 executes system calls that activate one or more components in the computing device 104. The FSM model data 158 include empirically determined estimates for the levels of power consumption that occur during productive and tail power states and the time duration for the power states. The FSM model is generated from power measurements that are made when the components are activated, operate for a predetermined time, and then return to low-power operating modes in base power state. In many embodiments of computing devices, however, the power state of a component is controlled through a OS-exported API calls that manipulate a special data object inside the OS called "wake lock." The wake lock acquire system call sets the power state of a component and the component does not leave the power state until a subsequent wake lock release system call releases the wake lock.

Figure 8:
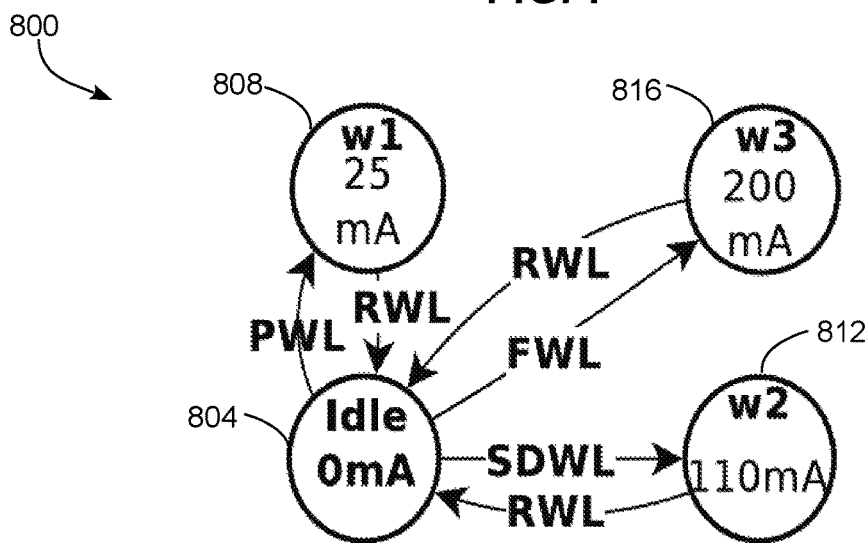
FIG. 8 is a diagram of an FSM model of power states for a component with power states that are reached in response to acquisition and release of wake locks.

FIG. 8 depicts an FSM model graph 800 including power states and transitions for a display, such as the display 140. In FIG. 8, the display 140 is in a base power state 804 when the display is deactivated during use of the computing device 104. The display 140 transitions to different power state in response to a wake lock acquire system call that places the display into a dimmed output power state 808, intermediate brightness power state 812, or a full brightness power state 816. The display 140 remains in the power state that corresponds to the issued wake lock for an indeterminate time until a wake lock release system call returns the display 140 to the base power state 808, which may be an intermediate power state as the display 140 transitions between multiple brightness levels using a series of system calls to acquire and release wake locks. The display 140 remains in an elevated power state to generate a graphical display while the lock is active even if the display 140 would normally return to a lower base power state in the absence of input commands through the input device 144. The wake locks are typically manipulated via as a type of wake lock acquire and release system calls and the instrumented OS 152 and frameworks 154 trace the execution of the wake lock acquire and release system calls. Unlike other forms of system calls, however, the duration of the power state for the component for which the wake lock is acquired is indeterminate. Thus, instead of returning the base power state after performing an operation, the component remains in an elevated power state until execution of a wake lock release system call to release the wake lock.

Figure 4:
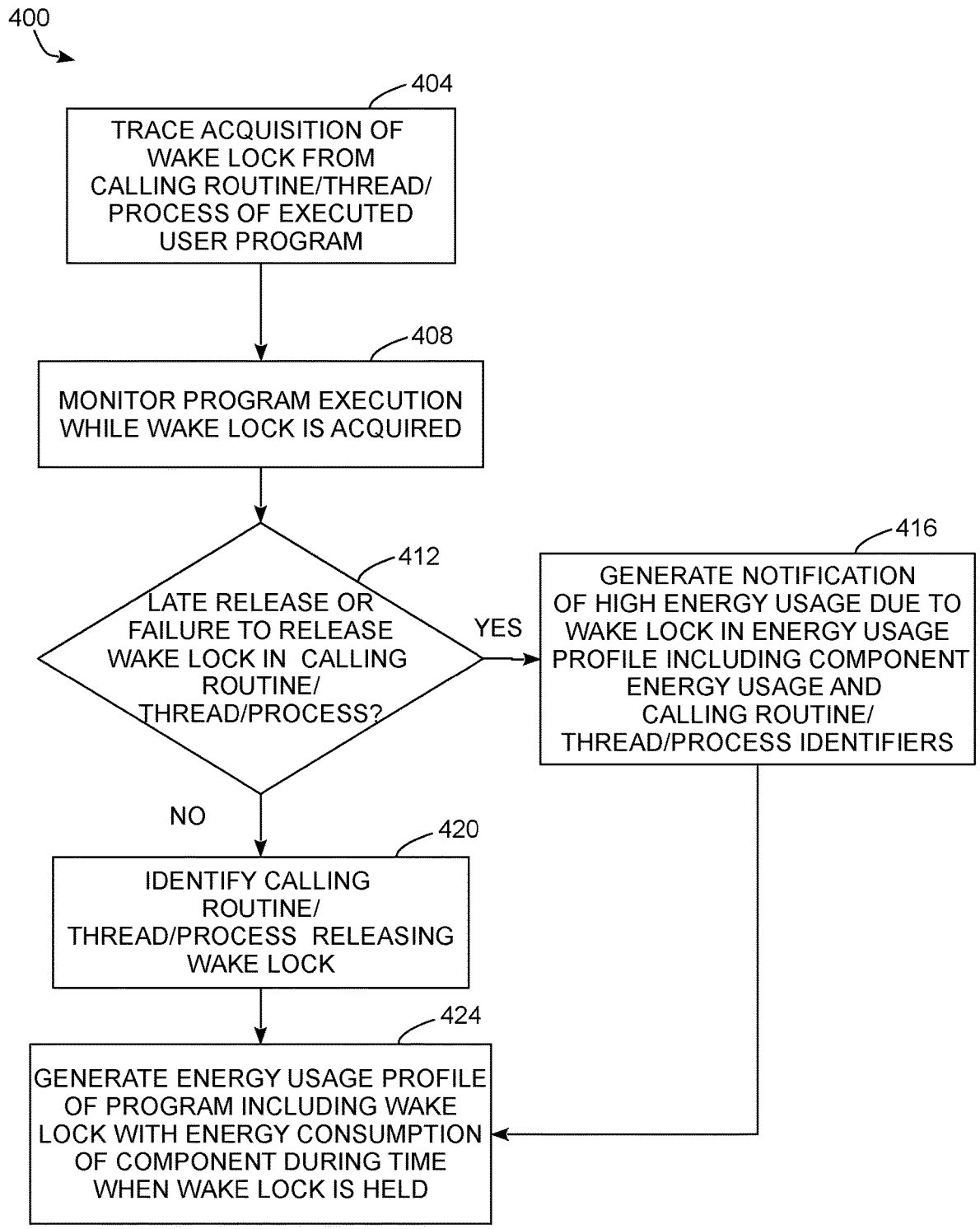
FIG. 4 is a block diagram of a process for identifying the acquisition and release of wake locks that affect the power state of a component in a computing device during execution of a software program.

FIG. 4 depicts a process 400 for identifying the acquisition and release of wake locks during execution of a user program. Process 400 is performed in conjunction with the process 200 to generate an energy usage profile for the user program. Process 400 uses the system call traces and identified power states from the FSM model data that are generated during process 400 to identify the acquisition and release of wake locks and to identify if wake locks are acquired but not released in a timely manner. In the discussion below, a reference to the process 400 performing a function or action refers to a processor executing programmed instructions stored in a memory to operate one or more components in a computing device to perform the function or action. Process 400 is described in conjunction with the computing device 104 of FIG. 1 for illustrative purposes.

Process 400 begins with generation of a system call trace for execution of a user program that acquires a wake lock for a component in the computing device (block 404). The trace for the wake lock identifies the routine, thread, and process in the user program that is responsible for acquiring the wake lock and a timestamp when the wake lock is acquired. Process 400 continues to monitor the program, including the tracing of system calls to components in the computing device 104, while the wake lock is acquired (block 408).

Process 400 continues until either the user program issues another system call to release the wake lock or the duration of the wake lock being held is identified as exceeding a predetermined limit (block 412). For example, in one configuration if the wake lock is held for longer than a predetermined time then the process 412 generates a notification that the wake lock release has not been issued in the energy usage profile (block 416). The notification includes the system call trace information that identifies the routine, thread, and process in the user program that acquired the wake lock. In addition to a timeout based on an elapsed time from acquiring the wake lock, other thresholds can be used to identify failure to release the wake lock. For example, in one configuration if the thread that acquires a wake lock terminates without releasing the wake lock, then the process 400 generates the notification. In another configuration, a calling routine that acquires the wake lock is expected to release the wake lock, and if the calling routine returns without releasing the wake lock, the process 400 identifies that the wake lock is still acquired after completion of the routine and generates the notification. In another configuration, the user program acquires the wake lock to the component and the user program terminates in a manner where the wake lock is never released. Process 400 generates a notification message identifying the routine, thread, and process in the user program that acquired the wake lock and that the wake lock was not released during execution of the program.

During the process 400, the user program can also release the wake lock within a predetermined period of time (block 412), the process 400 also identifies the routine, thread, and process in the user program that releases the wake lock (block 420). Process 400 continues with generation of the energy usage profile including the energy consumption of the component that is subject to the wake locks (block 424). Using the FSM model graph 800 as an example, the process 400 identifies a time at which the wake lock for the display 140 is acquired as the display transitions to the power state 812 from the base power state 804. The FSM model 800 identifies a current consumption level of 110 mA during the power state 812, which is converted to a power consumption figure with reference to a predetermined supply voltage for the computing device 104. The energy usage profile includes an estimate of the energy consumed by the display 140 as a product of the power consumption level in the power state 812 multiplied by the duration between acquisition of the wake lock and release of the wake lock. In addition to the energy consumption of the component due to issued wake locks, the energy usage profile includes any notifications that are generated due to a wake lock being held for greater than a predetermined time or when the lock is not acquired and released by a single routine, thread, or process. During a software development process for the user program corresponding to the energy usage profile, software developers and testers can identify situations where wake locks should be released to reduce the energy consumption of the user program.

Figure 9:
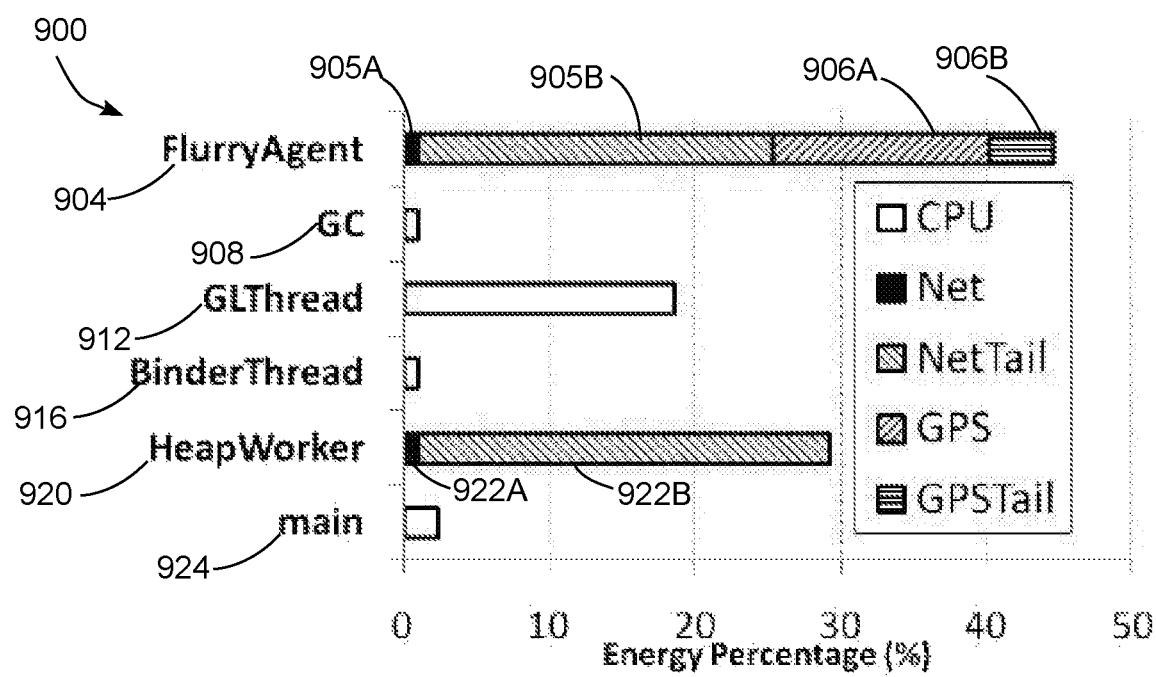
FIG. 9 is a diagram depicting energy consumption due to a software program that is represented in an energy usage profile for the software program.
Figure 9:
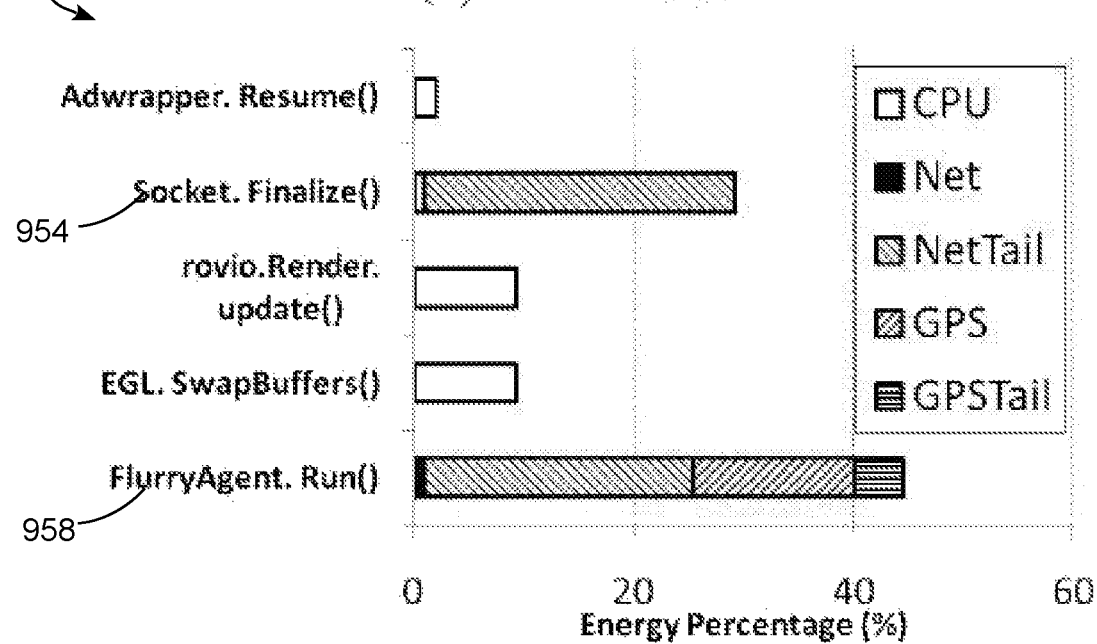

FIG. 9 depicts two graphs including energy usage data that are included in the energy profiles that are generated using the processes 200, 300, and 400. The graphs in FIG. 9 are illustrative examples of visual output that is generated based on the data in a stored energy usage profile of a software program using a display device, such as the display 140 in the computing device 104. FIG. 9 includes graphs that are generated from an energy usage profile from execution of the Angry Birds software application that is produced by Rovio Entertainment Limited of Espoo, Finland. The energy profile that is depicted graphically in FIG. 9 was generated using an HTC Passion smartphone using the Android operating system and software framework, but similar elements from the computing device 104 are referenced below. The Angry Birds program is a game that presents a graphical user interface to a user and includes hardware accelerated graphics that are produced using the GPU 116 and the display 140, with computations for simulated physics that are performed using the CPU 112. Some versions of the Angry Birds game access the GPS 128 and the wireless networking component 132 to identify the geographical location of the computing device 104 and to download advertisements that are presented through the display 140 while executing the program.

In FIG. 9, the graph 900 depicts the energy consumption of different threads of execution while running the Angry Birds program. The garbage collection GC thread 908, OpenGL graphics GLThread 912, BinderThread 916, and main thread 924 each consume electrical energy using primarily the CPU 112 and GPU 116. The energy profile includes energy consumption information for the threads 908, 912, 916, and 924 generated using prior art CPU and GPU energy utilization processes. In the graph 900, however, the energy consumption in the FlurryAgent thread 904, and HeapWorker thread 920 are dominated by the energy consumption of the GPS component 128 and wireless network component 132 instead of by activity in the CPU 112 or GPU 116. In the Angry Birds program, the FlurryAgent thread 904 is responsible for accessing the GPS 128 to identify the location of the computing device 104 and to download advertisements from a remote server. The GPS data enables the FlurryAgent thread to download advertisements that are relevant to the location of the mobile device 104. As depicted in the graph 900, the FlurryAgent thread is the single largest consumer of energy in the Angry Birds application, and is responsible for with 45% of the energy of the application energy consumption. In particular, the system calls that access the wireless network component 132 consume a proportionally small amount of energy in the productive power states 905A, but a much larger amount of energy in the tail power states 905B. The system calls to the GPS 128 also consume energy in the productive power state 906A and the tail power state 906B. The HeapWorker thread 920 is similarly dominated by energy consumption in I/O operations through system calls to the wireless network device 132 with a small energy consumption in the productive power state 922A and much larger tail power states 922B. The graph 950 depicts individual software routines that consume large amounts of energy in the Angry Birds application. The Socket.Finalize( ) function 954 invokes a socket close system call that transitions the wireless network component 132 into a tail power state as depicted by the large tail power usage in the graph 950. Additionally, the FlurryAgent.Run( ) function 958 is invoked as part of the FlurryAgent thread 904 to identify the location of the computing device 104 and retrieve advertisements with the wireless network component 132. As depicted in the graph 950, in many programs a small number of routines generate the system calls that leads to the large amounts of energy consumption. The processes 200, 300, and 400 generate the energy usage profile that identifies the particular routines that are "hot spots" for energy consumption in a fine-grained manner that enables software developers to identify specific portions of the software program that consume energy.

As clearly depicted in the graphs 900 and 950, the combined energy consumption of non-processor components such as the GPS 128 and the wireless network component 132 forms the majority of the energy consumption during execution of the Angry Birds program. The tail power state energy consumption for the wireless network component 132 is larger than the combined energy consumption of the CPU 112 and GPU 116. Thus, traditional energy measurement tools that only analyze the energy usage of the processor using utilization models would fail to identify the majority of the energy consumption in the Angry Birds program that is identified in the energy usage profile generated by the processes 200, 300, and 400. The energy profiles generated using the methods described above enable software developers to analyze the energy consumption of software programs to reduce energy consumption due to I/O operations in what are typically a small number of "hot spot" routines and threads, which enables improvements to battery life and system performance in a wide range of computing devices.

It will be appreciated that variants of the above-described and other features and functions, or alternatives thereof, may be desirably combined into many other different systems, applications or methods. Various presently unforeseen or unanticipated alternatives, modifications, variations or improvements may be subsequently made by those skilled in the art that are also intended to be encompassed by the following claims.

What is claimed:

1. A method for generating an energy usage profile comprising:
   executing program instructions corresponding to a first system call in a software program with a processor in a computing device, the processor operably coupled to provide signals to a component that consumes power in the computing device in response to execution of the first system call;
   generating a first call trace of the execution of the first system call with the processor, the generation of the first call trace further comprising:
      generating a first timestamp corresponding to a first time at which the first system call is executed; and
      generating a first identifier comprising at least one of the group consisting of a calling routine identifier, a thread identifier, and a process identifier for the software program that executes the first system call;
   identifying a first power consumption level of the component and a first duration of the first power consumption level during the first system call based on the first call trace and a first power state in a stored model;
   identifying a second power consumption level of the component and a second duration of the second power consumption level that occurs after completion of the first system call based on a second power state in the model, the first time stamp and the first duration;
   generating an energy usage profile for the software program associating the first identifier with an estimate of energy consumption of the component in response to the execution of the first system call based at least in part on the first power consumption level, the first duration, the second power consumption level, and the second duration; and
   storing the energy usage profile in a memory.

2. The method of claim 1, the identifying of the first power consumption level further comprising:
   identifying a first transition from a base power state in a stored finite state model to the first power state corresponding to the first power consumption level in the finite state model in response to the execution of the first system call, the first power state being a productive power state.

3. The method of claim 2, the identifying of the second power consumption level further comprising:

identifying a second transition from the first power state in the finite state model to the second power state corresponding to the second power consumption level in the finite state model in response to the completion of the first system call, the second power state being a tail power state.

4. The method of claim 3 further comprising:

identifying the second duration of the second power consumption level based on a predetermined duration stored in the second power state in the finite state model.

5. The method of claim 1, the storing of the energy usage profile further comprising:

storing the energy usage profile in the second memory of an external computing device.

6. The method of claim 1, wherein the computing device further comprises a mobile computing device.

7. The method of claim 1, wherein the component comprises a circuit, device, or system within the computing device that consumes electrical power during operation and interacts with the processor through an I/O channel that provides a unidirectional or bidirectional communication path for sending and receiving digital data with the processor.

* * * * *